United States Patent [19]

Bloomer

[11] Patent Number: 4,620,258
[45] Date of Patent: Oct. 28, 1986

[54] CIRCUIT FOR SELF-COMMUTATED TURN-OFF OF LATCHED DEVICES, SUCH AS OF THE INSULATED-GATE TRANSISTOR/RECTIFIER TYPE

[75] Inventor: Milton D. Bloomer, Scotia, N.Y.

[73] Assignee: General Electric Company, Schenectady, N.Y.

[21] Appl. No.: 595,179

[22] Filed: Mar. 30, 1984

[51] Int. Cl.⁴ ............................................. H02H 3/20
[52] U.S. Cl. ...................................... 361/91; 361/56; 361/111; 330/298; 330/207 P
[58] Field of Search ...................... 361/87, 93, 98, 56, 361/86, 91, 111; 307/131, 240, 573, 575, 577; 323/223, 349, 350, 351; 330/207 P, 298

[56] References Cited

U.S. PATENT DOCUMENTS

| | | | |
|---|---|---|---|
| 4,355,341 | 10/1982 | Kaplan | 330/207 P X |
| 4,429,339 | 1/1984 | Jaeschke et al. | 361/93 |
| 4,480,201 | 10/1984 | Jaeschke | 307/575 X |
| 4,497,010 | 1/1985 | Funahashi | 361/93 |
| 4,525,765 | 6/1985 | Brajder | 361/98 X |

Primary Examiner—A. D. Pellinen
Assistant Examiner—Derek S. Jennings
Attorney, Agent, or Firm—Geoffrey H. Krauss; James C. Davis, Jr.; Marvin Snyder

[57] ABSTRACT

A circuit for the commutated turn-off of latched power switching devices, such as of the insulated-gate transistor/insulated-gate rectifier type, monitors the gate drive voltage and a load-current-related parameter (e.g. the collector/anode voltage) of the at least one power switching device connecting a load to a source. Comparator outputs provide logic signals indicating whether the at least one switching device has latched or has turned off in normal manner, responsive to cessation of gate drive. Circuitry for providing a cyclic gate drive signal is enabled whenever a latched condition is detected. The cyclic signals occur until the latched device is actually turned off, at a driven-unlatching current typically one-half the device latching current and typically at least an order of magnitude greater than the current at which the device will undergo self-unlatching turn-off.

14 Claims, 9 Drawing Figures

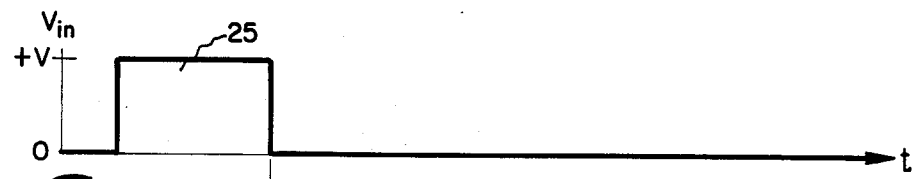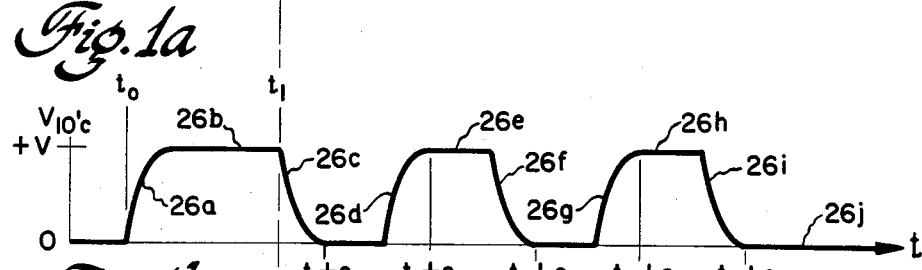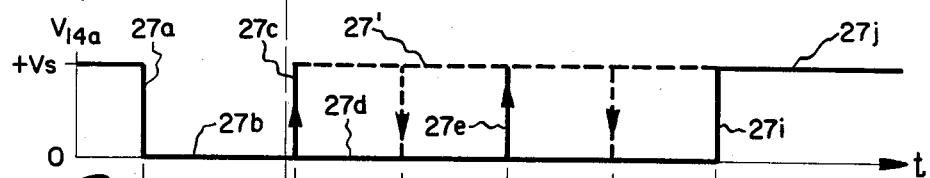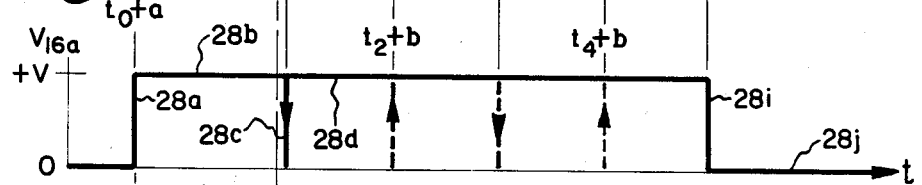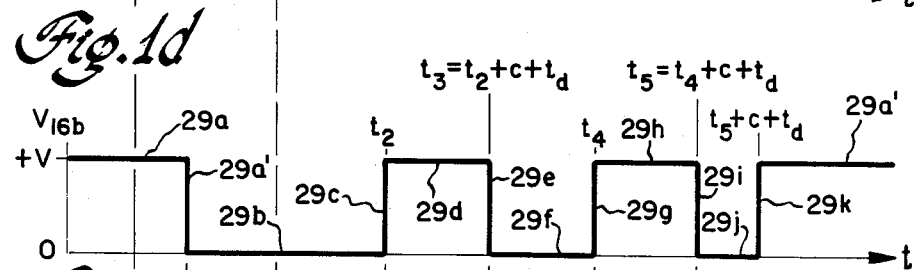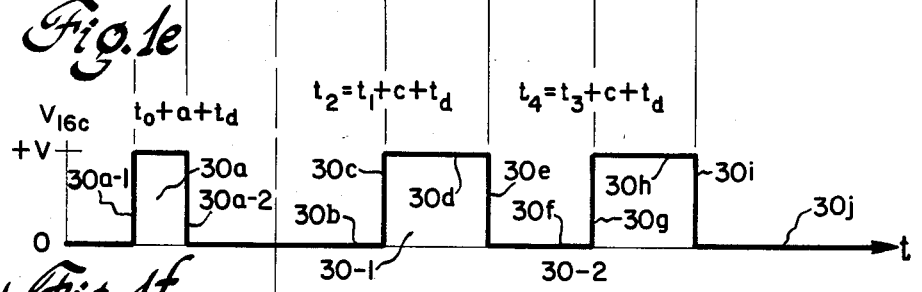

CIRCUIT FOR SELF-COMMUTATED TURN-OFF OF LATCHED DEVICES, SUCH AS OF THE INSULATED-GATE TRANSISTOR/RECTIFIER TYPE

BACKGROUND OF THE INVENTION

The present application relates to a circuit for assuring the turn-off of a power switching device and, more particularly, to a novel circuit for the self-commutated turning-off of latched power switching devices of the insulated-gate transistor/rectifier type.

It is now well known that the insulated-gate transistor, sometimes also referred to as an insulated-gate rectifier, has desirable power-control characteristics, in that (1) like a power field-effect transistor, it is a voltage-controlled device and (2) it has a saturation voltage drop similar to that of a bipolar power transistor, and lower than that of the typical power field-effect transistor. The insulated-gate transistor (IGT) currently has an undesirable latching characteristic, in that parasitic transistors in the IGT structure may latch into conduction and cause the loss of the ability to control the turn-off of the device main current flow by reduction of the device gate-source voltage. The device holding current, i.e. the collector-emitter current at which the IGT structure will unlatch with substantially zero gate drive, has been found to be at least two orders of magnitude below the level of current which causes the latching phenomenon to occur. Thus, a typical IGT device which might latch while conducting 20 amperes of collector current will not unlatch until the collector current falls below 0.2 amps, with a substantially zero gate-emitter voltage. This same IGT deVice, however, might unlatch at about 10 amperes of collector current if the gate drive is left turned on; however, retaining the gate drive in the turned-on condition is contrary to the desired turning off of the device. Thus, while use of one (or several parallelled) IGT, or IGR, to switch load power from a unipolarity source, of the types which might be characterized as a D.C. link-capacitor source, a high-ripple rectified-A.C. source and the like, or use of a plurality of such devices to switch load power from an A.C. bipolarity source, has distinct advantages over the use of the common power field-effect transistor with respect to power loss considerations, such advantages may be negated by the latching problem. Since latching may result from various phenomena (including, but not necessarily limited to, start-up current in-rush, supply transients, the too-rapid decrease of gate-emitter voltage and the like) when attempting to enter the turned-off condition, the power circuit designer often finds that the IGT-type device has latched and can therefore not be turned off by removing the gate electrode drive. In D.C. switching applications, the D.C. link current must collapse to less than about 1 percent of the latching current value, while in rectified or bipolarity A.C. circuits, the source waveform must nearly reach a natural current zero before the device will remove itself from the latching condition and turn itself off, after removal of the gate-emitter drive voltage. In the former case, a collapse to less than about 1 percent of the latching current value will almost never occur in a practical circuit. In any case, either the load or the IGT switching device may be destroyed by the excessive power dissipated during the excessive current conduction time introduced by latching of the IGT/IGR power switching device.

It is therefore highly desirable to provide a circuit capable of detecting when a power switching device of the IGT/IGR type is in a latched condition and for accomplishing a turning-off of that device at a much higher level of current than the normal holding current.

BRIEF SUMMARY OF THE INVENTION

In accordance with the invention, a circuit for the self-commutated turning-off of a power switching device of the IGT/IGR-type, having a gate electrode and a current-flow circuit controlled by the drive signal at the gate electrode, comprises: means for monitoring a load-current-related parameter (e.g. the voltage across the controlled circuit of the device) to detect a latched condition; means for monitoring the gate drive signal magnitude to detect a reduction in the magnitude thereof sufficient to require a turning-off of current flow through the controlled circuit of the switching device; and means for pulsing the gate drive signal, responsive both to detection of a gate drive signal turn-off magnitude and detection of a device-latched condition, to cause the device to turn off at a current magnitude greater than the device normal holding current.

In one presently preferred embodiment of a self-commutated turn-off circuit for use with a device switching a unipolar voltage, a different one of a pair of comparators monitors each of the IGT/IGR collector and gate voltages to each provide a predetermined logic level to logic means if a latched condition of collector voltage magnitude is detected while a turn-off magnitude of gate drive voltage signal exists. The logic means then cyclically reapplies and removes the gate signal until the switching device is removed from the latched condition.

In other presently preferred embodiments for controlling a periodic A.C. voltage utilizing a plurality of IGT/IGR devices, the controlled-circuit voltage across each device is monitored to detect whether any of the devices are in the latched condition and the logic means cyclically applies and removes the gate drive signal to cause the latched switching device to turn off at a current level substantially (i.e. typically at least an order of magnitude) higher than the normal holding current level thereof.

Accordingly, it is an object of the present invention to provide novel circuits for the self-commutated turn-off of latched power switching semiconductors, particularly of the insulated-gate transistor/rectifier type.

This and other objects of the present invention will become apparent upon consideration of the following detailed description, when read in conjunction with the drawings.

BRIEF DESCRIPTION OF THE DRAWINGS

FIGS. 1a–1f are a set of time-coordinated graphs illustrating the signal voltage waveforms at various points in the circuit of FIG. 1.

DETAILED DESCRIPTION OF THE INVENTION

Figure 1:
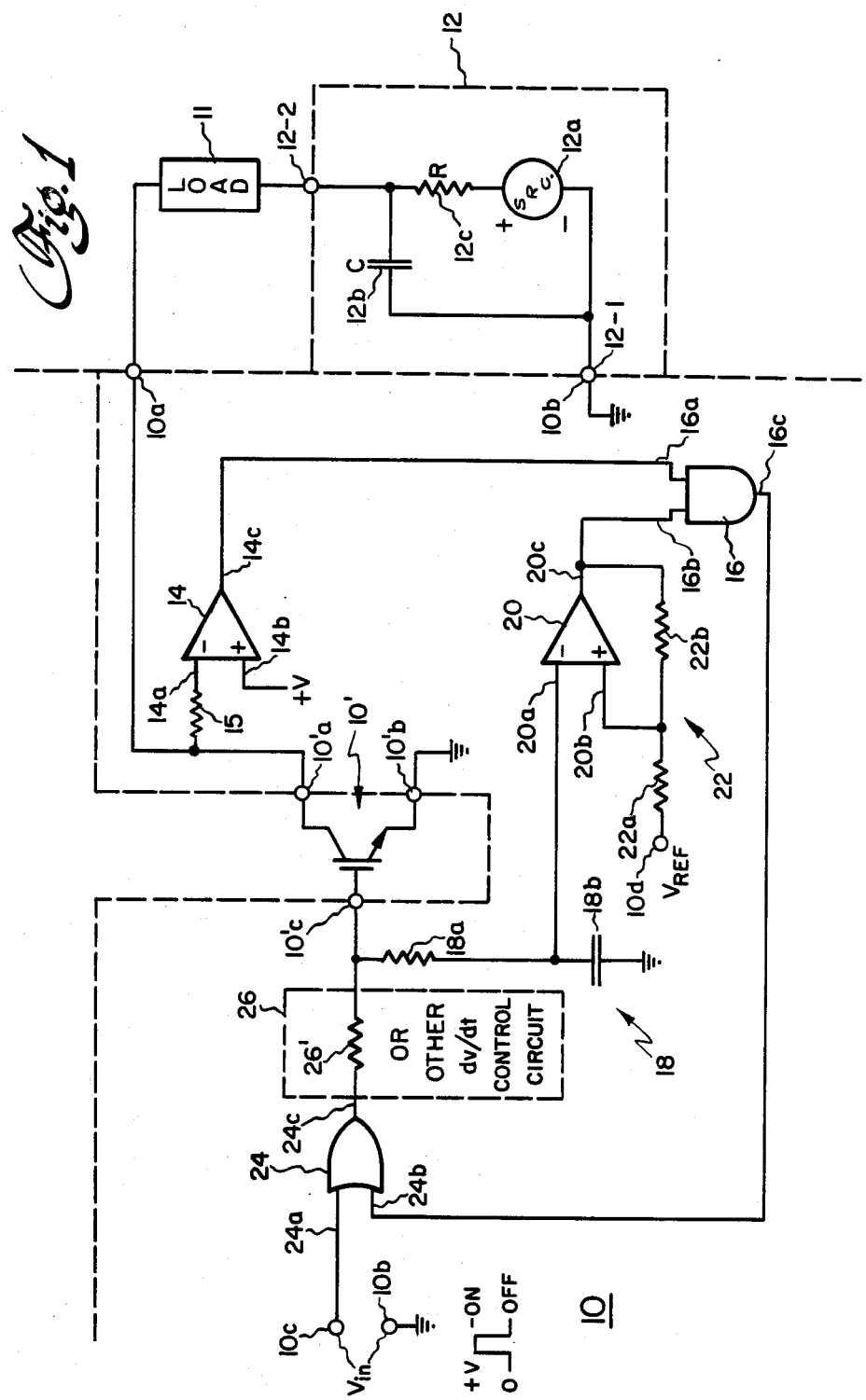
FIG. 1 is a schematic diagram of one presently preferred embodiment of the self-commutated turn-off circuit of the present invention, connected with an insulated-gate power switching device with which the circuit is used, a load and a unipolar source, and is useful for appreciating the basic principles of operation of the present invention.

Referring initially to FIG. 1, one presently preferred embodiment of my novel circuit 10 is utilized for the self-commutating turn-off of an associated insulated-gate transistor (IGT) or insulated-gate rectifier (IGR) 10', controlling the flow of current to a load 11 from a unipolarity source 12. For purposes of explanation, unipolarity source 12 is a test source using a variable-magnitude D.C. source 12a, having its negative terminal connected to a source common terminal 12-1. The D.C. source 12a charges a D.C. link capacitor 12b, of capacitive magnitude C, through a charging resistor 12c of resistive magnitude R. The voltage across the link capacitor 12b, connected between supply common terminal 12-1 and supply output terminal 12-2, is to be connected and disconnected, respectively, across load 11 by the turning-on and turning-off of IGT switching device 10'. Accordingly, load 11 is connected from the unipolarity supply output terminal 12-2, via a control circuit first terminal 10a to a control circuit switching device collector electrode connection terminal 10'a, and thence to the collector electrode of IGT switching device 10'. The supply common terminal 12-1 is connected to a control circuit terminal 10b at circuit common potential; the IGT switching device emitter electrode is connected to another circuit common potential terminal 10'b, to complete the source-switching device return circuit. The gate electrode of IGT switching device 10' is connected to a control circuit gate control terminal 10'c, at which the switching device gate-emitter control voltage $V_{10'c}$ appears.

In accordance with the invention, a load-current-related parameter of the IGT/IGR controlled-conduction circuit is monitored by a first comparison means, utilizing a first comparator 14. The monitored parameter can be the voltage between terminals 10'a and 10'b, as illustrated, or the device 10 anode/collector current (sampled across a series resistor, not shown) or any other parameter related to device controlled-circuit current flow. For the illustrated voltage-monitoring embodiment, an inverting − input 14a of the comparator is connected, via a current-limiting resistance 15, to the collector/anode terminal 10'a of the control circuit. The remaining, non-inverting + input 14b of the comparator receives a reference potential selected such that the comparator output 14c voltage will change between first and second binary logic values if the terminal 10'a voltage is respectively above and below the input 14b voltage. The input 14b voltage must be some predetermined value associated with device 10' actually being in the turned-off condition. I have utilized the positive circuit operating potential +V, e.g. a +15 volt operating potential, for the reference signal at input 14b, as the forward, or saturated, voltage drop between terminals 10'a and 10'b of a "turned-on" device 10' should never exceed this level. Thus, the first comparator output 14c will have a voltage thereat which is a high, logic 1 level if the comparator first input 14a voltage, being the switching device controlled-circuit voltage, is less than the +V magnitude (indicative of a turned-on device) and will have a low, or logic 0, level thereat if the voltage at input 14a exceeds the +V voltage, indicative of device 10' being in the turned-off condition.

The first comparator output 14c voltage is applied to a first input 16a of a two-input AND gate 16. The voltage ($V_{16a}$) at this input will therefore be at a high, logic 1 level if power switching device 10' is normally conducting or is in the latched-on condition and will be at the low, logic 0 level if device 10' is in the turned-off condition.

The voltage ($V_{10'c}$) at gate drive terminal 10'c is applied to the input of a delay means 18, comprising a resistance 18a in series with a time delay capacitance 18b, between terminal 10'c and circuit common potential. The magnitudes of resistance 18a and of capacitance 18b are selected to provide a desired delay time constant. The junction between resistance 18a and capacitance 18b is connected to an inverting − input 20a of another comparator 20, comprising part of a second comparison means. The remaining, non-inverting + input 20b of the second comparator is connected to the output junction of a reference divider means 22, comprising a first resistor 22a connected between a reference voltage ($V_{REF}$) terminal 10d and second comparator input 20b, and another resistance element 22b connected between input 20b and the second comparator output 20c. The comparator output 20c is connected to the remaining input 16b of AND gate 16. The reference voltage at terminal 10d is established, in conjunction with the values of reference resistors 22a and 22b, such that the voltage at the non-inverting input 20b of second comparator 20 is substantially at, or slightly below, the gate threshold voltage of switching device 10'. The reference voltage at circuit terminal 10d may be the circuit operating potential +V, with the ratio of resistance 22a to resistance 22b being established by adjustment of the resistances to cause the comparator output 20c voltage to fall to a low logic value when a gate voltage is present at terminal 10'c, in the steady state, at a magnitude sufficient to turn-on device 10'.

The circuit control input voltage $V_{in}$ is applied between an input terminal 10c and the circuit common terminal 10b. Terminal 10c is connected to a first input 24a of a two-input OR gate 24, having its remaining input 24b connected to the output 16c of AND gate 16. The output 24c of the OR gate is coupled to the switching device gate electrode terminal 10'c; typically, gate output 24c will be coupled to terminal 10'c through some means 26 for controlling the gate voltage time-rate-of-change (dv/dt). While many forms of gate dv/dt control circuit means are known, for purposes of illustration, a single resistance 26' is connected between gate output 24c and control electrode terminal 10'c. By proper selection of the magnitude of resistance 26', the rate at which the power switching device 10' gate-emitter capacitance is charged, and therefore the rate at which the device 10' is turned-on responsive to a high, logic 1 level at gate output 24c, is established. Having so established the turn-on gate dv/dt characteristics, the time delay 18 time constant is selected to be sufficiently long to allow switching device 10' to accomplish a normal turn-on, responsive to a logic 1 level at gate output 24c, before the second comparator output 20c voltage rises to a high, logic 1 level from the logic 0 level thereat when the control electrode terminal 10'c is at a low level voltage.

It will be seen that the high, "turn-on" value of gate voltage is present if either the input voltage $V_{in}$ is at a high level (illustratively +V volts), or if the AND gate output 16c is at a high logic level, and that the switching device gate electrode will receive a low, logic 0 level only if both the input control $V_{in}$ voltage is at an "off" level, e.g. about 0 volts, and the AND gate output 16c voltage is also at a low, logic 0 level, e.g. about 0 volts.

Referring now to all of FIGS. 1 and 1a-1f, operation of the control circuit with a single controlled IGT/IGR device 10′, to control current flow through a load 11 from a unipolarity source 12, is as follows:

Turn-On Operation—Prior to turn-on time $t_0$, the input voltage $V_{in}$ (FIG. 1a) is at the "off" level, shown as a low, logic 0 level. The input voltage has been at this level for a sufficient time to cause the gate voltage at terminal 10′c (FIG. 1b) to also be at a low, logic 0 level, and to cause the second comparator output voltage, at AND gate second input 16b (FIG. 1e) to be at a high, logic 1 (or +V) level. Device 10′ has been in the turned-off condition, and the collector/anode voltage, i.e. the voltage at first comparator input 14a, (FIG. 1c) has reached the source output terminal 12-2 voltage $+V_s$ level, while the first comparator output has provided a low, logic 0 level (FIG. 1d) at the AND first gate input 16a. Responsive to the low logic level at at least one input, e.g. input 16a, the AND gate output 16c voltage (FIG. 1f) is at the low, logic 0 level.

At turn-on time $t_0$, the input voltage $V_{in}$ is changed to the high, logic 1 (+V) level and maintained thereat until a later time $t_1$, when the input control voltage pulse 25 returns to the low, logic 0 level. Responsive to the high, logic 1 level at time $t_0$, the switching device 10′ gate electrode voltage at terminal 10′c increases, with a time constant determined, as previously mentioned hereinabove, by the magnitude of the resistance 26′ and the gate-emitter input capacitance of the device 10′, to substantially exponentially charge, as shown at portion 26a, to the full input level 26b some time thereafter. Thus, after some small turn-on delay a, i.e. at time $t_0+a$ (where the time constants of portions of waveform 26 and times a, b, c, etc., have all been exaggerated for purposes of illustration), device 10′ is turned on, whereby the collector-emitter voltage, between terminals 10′a and 10′b falls to a low level and the first comparator input 14a voltage (FIG. 1c) falls, in portion 27a, to the low level 27b. Current flows from source output terminal 12-2, through load 11, then through in the connection between circuit terminals 10a and 10′a, through the collector-emitter controlled circuit of switching device 10′ and thence from circuit terminal 10′b to 10b at the power supply return terminal 12-1. Responsive to the reduction in voltage at input 14a, comparator 14 switches the voltage at the output 14c thereof and the first AND gate input 16a voltage (FIG. 1d) has a rising edge 28a to the high, logic 1 level 28b. Due to the delay imposed by means 18, the voltage at second AND gate input 16b remains at a high level 29a until a time $t_0+a+t_d$, where $t_d$ is the delay means 18 time delay, before falling to a logic 0 level 29b. Accordingly, for some time at the beginning of the input "on" control pulse 25, the AND gate output 16c voltage (FIG. 1f) is at the logic 1 level, as shown in pulse 30a. Since the leading edge 30a-1 of this pulse occurs at time $t_0+a$, after the initiation of the input control pulse at time $t_0$, and the falling edge 30a-2 of this pulse occurs at the time $t_0+a+t_d$, responsive to the falling edge 29a′ of the second comparator output voltage, and this time is made prior to the time $t_1$ at which the input control pulse 25 returns to a logic 0 level, pulse 30a is generally sufficiently short to have no practical effect on the gate drive voltage. If input pulses 25 of very short duration are required, even pulse 30a can be eliminated by use of well-known logic circuitry.

Normal Turn-Off Operation: commences at time $t_1$, when input pulse 25 terminates and the input voltage $V_{in}$ falls to the logic 0 level. As the AND gate output 16c voltage has previously returned to the logic 0 level in portion 30b of FIG. 1f, both inputs of OR gate 24 are at the logic 0 level and a logic 0 level is present at the gate output 24c. The switching device gate voltage, at terminal 10′c, falls, as shown by portion 26c in FIG. 1b, with a time constant determined by the resistance, e.g. resistor 26′, from terminal 10′c substantially to circuit common potential, discharging the gate-emitter capacitance of device 10′. While gate voltage portion 26c does not reach the logic 0 level until some time $t_1+c$, the switching device gate turn-off threshold is reached at some earlier time $t_1+b$ and the switching device collector voltage (FIG. 1c) rises with rising edge 27c to the source voltage $V_s$ magnitude. The rising voltage at first comparator input 14a causes first comparator output 14c to fall, such that the first AND gate input 16a signal (FIG. 1d) has a falling edge 28c, to the logic 0 level. As the second AND gate input 16b voltage is, as shown in portion 29b, still at the logic 0 level, the gate output 16c voltage remains at the low, logic 0 level, maintaining the OR gate output voltage at its low level, whereby the switching device 10′ remains in the normal turned-off state. Thus, even though the second comparator output 20c will eventually rise to a high, logic 1 level (equivalent to portion 29a for a turned-off switching device 10′), this will occur after first comparator output 14c has fallen to the low, logic 0 level and gate output 16c will remain at a low, logic 0 level and have no effect upon the normal turn-off sequence.

Latched Turn-Off Operation: also commences at time $t_1$, when the input voltage pulse 25 returns to the logic 0 level. The voltage at terminal 10′c again falls with portion 26c. However, at time $t_1+b$, switching device 10′, being in the latched condition, does not turn off and rising edge 27c does not occur. Instead, voltage $V_{14a}$ remains at the low, logic 0 level 27d. Thus, the voltage at terminals 10a/10′a/14a does not rise to the source voltage $V_s$ level 27′ (shown in broken line in FIG. 1c), because device 10′ is in the latched condition. The first comparator output 14c voltage remains at a high, logic 1 level causing the AND gate first input 16a voltage to remain at a high, logic 1 level 28d, because falling edge 28c does not occur.

The falling gate voltage, at gate electrode terminal 10′c, is delayed by delay means 18, such that the second comparator 20 changes the state of the voltage at the output 20c thereof at some time $t_2=t_1+c+t_d$. Thus, at time $t_2$ (greater than time $t_1+c$) the voltage at second comparator input 20a falls to a level sufficient to raise second comparator output 20c and second AND gate input 16b to a high, logic 1 level, as shown by rising edge 29c and subsequent logic 1 level portion 29d, in FIG. 1e. Rising edge 29c combines with the logic 1 level already present at AND gate input 16a to cause the AND gate output 16c voltage (FIG. 1f) to have a rising edge 30c and thereafter be at the high, logic 1 level 30d. Even though the input control voltage $V_{in}$ remains at the low, logic 0 level, the logic 1 level now present at OR gate input 24b is transmitted through gate 24 and raises the switching device gate input voltage, at terminal 10′c, to a level 26e (in portion 26d) sufficient to turn the switching device gate electrode back on. The switching device 10′ controlled circuit does not actually respond to the gate being turned on again, as the device controlled-circuit was latched in the substantially saturated condition. The first AND voltage 16a therefore remains at logic 1 level portion 28d. However, responsive to the gate drive voltage $V_{10'c}$ rising to the logic 1 level of portion 26e, the voltage at the output of delay circuit 18 begins to rise and eventually, at a time $t_3=t_2+c+t_d$, reaches the level at which comparator 20 switches and causes the voltage at AND gate second input 16b to fall, with falling edge 29e, to a logic 0 level 29f. As both gate 16 inputs are no longer at the logic 1 level, the gate output 16c and first OR gate input 24b fall, with edge 30e, to a low, logic 0 level 30f, turning off the switching device gate drive voltage. The gate drive voltage decays toward zero, as shown in portion 26f, and at some time $t_3+b$ thereafter, the gate drive again falls below the gate threshold and device 10' again should turn off. If device 10' does, in fact, turn off at this time, the voltage at terminals 10a and 10'a and at first comparator input 14a rises, with edge 27e, to the source voltage level 27'. Thereafter, the device is in the "off" condition. Illustratively, it is assumed that the device current has not been reduced to about 50% of the latching current value and that the device again remains in the latched condition and does not turn off at time $t_3+b$. Accordingly, the falling gate voltage is delayed in delay means 18 and at some time $t_4$, where $t_4=t_3+c+t_d$, the falling voltage at second comparator input 20a is again low enough to cause the comparator output 20c and second AND gate input 16b to have a rising edge 29g to a high, logic 1 level 29h. Since the first gate input voltage $V_{16a}$ remains at the high level 28d, the voltage at AND gate 16c and OR gate input 24b again rises, with edge 30g, to the high, logic 1 level 30h. Responsive thereto, the device gate voltage again experiences a change in portion 26g commencing at time $t_4$, rising to a high, logic 1 level 26h by time $t_4+c$. Since the device is still latched, this second auxiliary turn-on of the gate electrode has no apparent effect. However, responsive to the rise in voltage at gate drive terminal 10'c, the delayed voltage at second comparator input 20a rises and the second comparator output 20c voltage falls at a time $t_5=t_4+c+t_d$. Responsive to the falling edge 29i of the second AND gate 16b voltage, to the low, logic 0 level 29j, the AND gate output voltage experiences a falling edge 30i to a low, logic 0 level 30j. This logic 0 level is supplied to OR gate input 24b and again removes the switching device gate drive. At this time, it is assumed, for purposes of illustration, that the current through the load has decreased sufficiently for a normal turn-off operation to occur, e.g. the load current is now about 10 amperes, with respect to a peak load current of 20 amperes, but is still at least an order of magnitude greater than the latch-holding current (of about 0.2 amperes) for the zero gate-drive turn-off condition. Therefore, the latch-holding current condition does not obtain, as the device gate electrode is being driven, and responsive to the falling edge 26i of the gate voltage (FIG. 1b), the switching device actually turns off, when the device current falls about one-half the latching current value. The collector voltage, at first comparator input 14a, now rises (with edge 27i) to the source voltage value 27j. Responsive to the switching device 10' actually turning off, the comparator output voltage and first AND gate input 16a voltage finally has a falling edge 28i to a logic 0 level 28j. As the first comparator input 14a voltage will remain at high level 27j, input 16a remains at low level 28j and gate output 16c remains at the low logic level 30j. At a time $(t_5+c+t_d)$ thereafter, the delayed falling gate drive edge causes second comparator output 20c to provide a rising edge 29k at AND gate input 16b, which is thereafter held at a high, logic 1 level 29a', whereby the signal magnitudes in the now-turned-off switching device and its turn-off circuit 10 have all returned back to the initial conditions, prior to a next subsequent turn-on of switching device 10'.

It will thus be seen that if a latchable, gate-driven switching device, of the IGT/IGR or the like type, is in the latched condition, the self-commutated turn-off circuit 10 will cyclically pulse the gate control electrode voltage of the switching device with relatively short pulses (of duration established by the delay characteristics of delay means 18 and dv/dt means 26, if used) and will cyclically apply the gate control pulses until the latched device current falls to a gate-driven-turn-off current, at some percentage of latching current magnitude, at which current the cyclically-pulsed gate signal will cause the latched switching device to turn off, at a load current substantially greater than (and typically at least one order of magnitude greater than) the self-unlatching, or holding, current of the switching device. It will be seen that, as the cyclic pulses (denoted as pulses 30-1, 30-2, ... in FIG. 1f) can be of relatively short duration, commensurate with the switching speed capability of the device 10', even a latched device 10' can be turned off in a relatively short time, thereby minimizing the additional power dissipation either in the switching device 10' or the associated load 11, with respect to the extra power dissipation therein experienced if self-unlatching turn-off were to be relied upon.

Figure 2A:
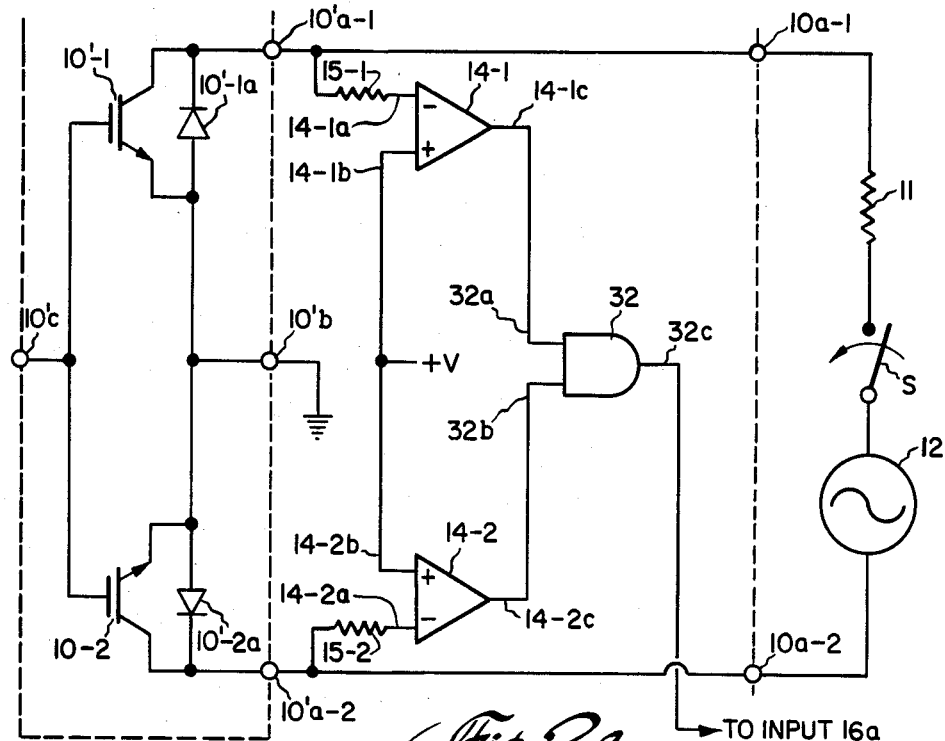
FIGS. 2a and 2b are schematic diagrams of a portion of the circuit of FIG. 1, configured to utilize a plurality of IGT/IGR devices for the switching of a bipolarity A.C. voltage to an associated load.
Figure 2B:
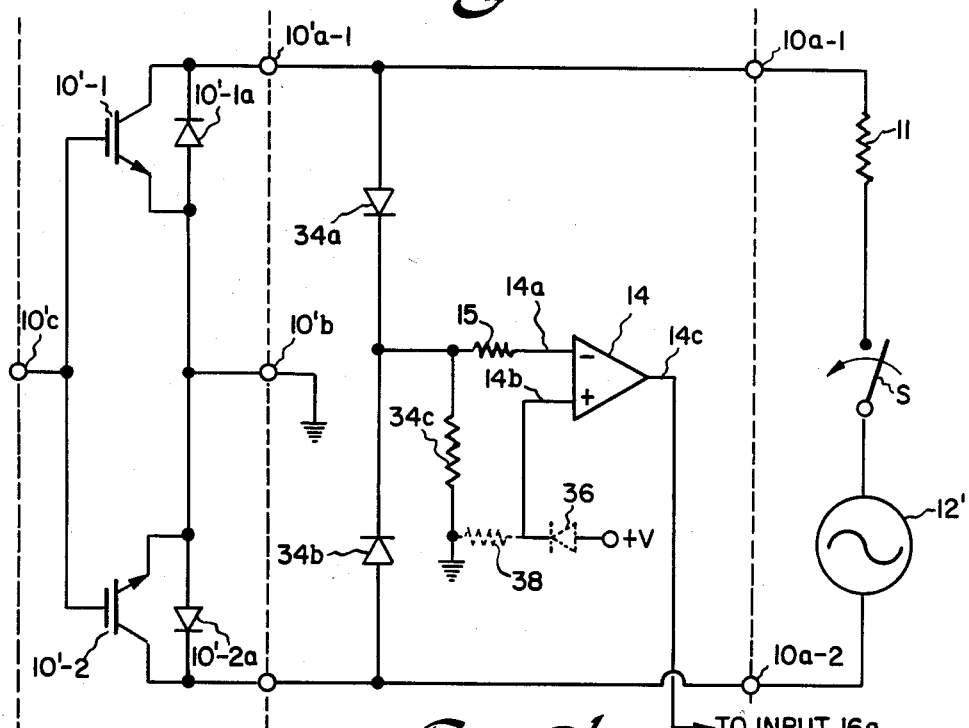

As previously mentioned, the self-commutated turn-off circuit can be utilized if a bipolarity A.C. source 12' drives load 11. If an A.C. source 12' is utilized, the single unipolar switching device 10' must be replaced by at least a pair of switching devices, as illustrated in FIGS. 2a and 2b. In both figures, a pair of IGT/IGR devices 10'-1 and 10'-2 are connected such that their gate electrodes are connected to the common gate electrode drive terminal 10'c, while the emitter/cathode electrode terminals of both devices are connected to the circuit common terminal 10'b. The collector/anode electrode of one switching device, e.g. device 10'-1, is connected to a first terminal 10'a-1 and thence to a first load-source connection terminal 10a-1, while the collector/anode terminal of the other device, e.g. device 10'-2, is connected to another terminal 10'a-2 and thence to a second load-source connection terminal 10a-2. The controlled-circuit of each of devices 10'-1 and 10'-2 is paralleled by a reverse-poled unidirectionally-conducting device, e.g. reverse-conduction diodes 10'-1a and 10'-2a, respectively.

When switch S, connected in series between load 11 and A.C. source 12', between terminals 10a-1 and 10a-2, is closed, that one of devices 10'-1 and 10'-2 then having a positive collector/anode voltage thereat conducts responsive to a gate drive signal at terminal 10'c, while the reverse-conduction diode across the other device conducts to complete the circuit. Illustratively, if the voltage on the switch side of source 12' is positive at a particular instant, current flows from source 12', through closed switch S and load 11, to terminals 10a-1 and 10'a-1, thence through switching device 10'-1 (if the proper gate control voltage has been applied to terminal 10'c) and thence through now-forward-biased diode 10'-2a, to terminal 10'a-2 and terminal 10a-2, and thence back to source 12'.

In one presently preferred embodiment, as shown in FIG. 2a, the first comparator means comprises a pair of comparators 14-1 and 14-2, each having the non-inverting − input 14-1b or 14-2b thereof connected to the comparator reference potential (circuit ope rating potential +V) and each having the inverting − input 14-1a or 14-2a separately connected through an associated one of current-limiting resistors 15-1 or 15-2, respectively, to the respective collector/anode terminals 10'a-1 or 10'a-2 of the associated switching device. The comparator outputs 14-1c or 14-2c- is each individually connected to one input 32a or 32b, respectively, of a two-input AND gate 32, having the output 32c thereof connected to the first input 16a of the subsequent AND gate. It will be seen that the conducting diode 10'-1a or 10'-2a, associated with each of the respective comparators 14-1 or 14-2, prevents the inverting input of that comparator from seeing an instantaneous negative voltage more than one diode drop below the circuit common potential. That comparator associated with a conducting diode is effectively inoperative during that polarity half-cycle portion of the source 12' waveform. The other comparator, having the protection diode across the associated switching device in a reverse-biased condition, receives the proper polarity collector/anode voltage from the associated switching device and operates in the same fashion as the single comparator 14, as explained hereinabove. As one or the other comparator outputs 14-1c or 14-2c may be switching to the low level at any particular time during the source cycle, AND gate 32 allows the appropriate transitions of either comparator output to be transferred to the AND gate input 16a.

While it is envisioned that the self-commutated turn-off circuit 10, for unipolarity or bipolarity sources, will be formed with one or both first comparators 14, second comparator 20, gates 16, 24 and 32, plus the desired dv/dt control circuit 26, delay means 18 and reference means 22 in a single multi-lead integrated circuit, to which circuit common and operating +V potentials and input $V_{in}$ signal will be provided and which will provide the switching device gate control signal at an additional terminal, while having terminals for monitoring the collector/anode voltage at at least one external switching device 10', it may be advantageous to reduce the cost of even the integrated circuit form, and certainly to reduce the cost of a discrete component form of the circuit as utilized with an A.C. source. The circuit of FIG. 2b allows the single first comparator 14 to be utilized, by the addition of a polarity-sensing "OR" input means 34. Means 34 includes first and second source-polarity-sensing diodes 34a and 34b, each having the anode thereof connected to the collector/anode 10'-1a or 10'-2a, respectively, of the associated IGT/IGR switching device, and having the cathodes thereof connected in common to one terminal of a resistance 34c, at the inverting input 14a of the single comparator. The remaining terminal of resistance 34c is connected to circuit common potential. The current-limiting resistance 15 is now connected between input 14a and the junction of resistor 34c and diodes 34a and 34b. In operation, when the collector/anode potential at the associated switching device is of negative polarity, the associated one of diodes 34a or 34b is reverse-biased. The presence of a positive potential at the collector/anode electrode of the other transistor (which occurs during substantially all of the source waveform half-cycle, except for a very short interval about a source voltage zero crossing) forward-biases the remaining one of diodes 34a and 34b, whereby the voltage developed across resistor 34c and present at comparator input 14a is one diode drop below the actual collector/anode voltage of the conducting device. Typically, the circuit operating potential +V will be such that the voltage drop across one of diodes 34a or 34b will not significantly affect the voltage at which comparator 14 switches its output 14c voltage. If, however, required in a particular circuit, an additional diode 36 and resistor 38, shown in broken line, can be added between the +V operating potential source and the comparator reference voltage input 14b, such that the forward-biased diode 36 voltage drop compensates for the voltage drop across that one of diodes 34a or 34b then conducting.

While my novel circuit for the self-commutated turn-off of latched insulated-gate transistor/insulated-gate rectifier power switching deviced has been described with reference to several presently preferred embodiments thereof, many modifications and variations will now become apparent to those skilled in the art. It is my intent, therefore, to be limited only by the scope of the appending claims, and not by the particular embodiments and instrumentalities presented by way of description herein.

What I claim is:

1. A circuit for the self-commutated turning-off of a power switching device of the type having a control electrode and a circuit in which the flow of current is controlled by the magnitude of a drive signal voltage at said control electrode, said controlled-circuit being characterized by latching in be conductive condition at a relatively high current level and remaining latched even in the presence of a turn-off magnitude of the control electrode signal voltage, until the controlled-circuit current is reduced to a holding current substantially less than said latching current, said circuit comprising:

means for monitoring only the voltage across the controlled-circuit of the switching device to provide a first signal responsive to detection of at least a latched condition;

means for monitoring the control electrode signal voltage magnitude to provide respective first and second conditions of a second signal responsive to detection of respective first and second magnitudes of said control electrode signal voltage sufficient to require a respective turning-off and turning-on of current flow through said switching device; and means for cylically pulsing the control electrode signal voltage, responsive only to the presence of both of (1) said first signal and (2) a selected one of said second signal conditions, to cause the switching device to turn off at a current magnitude greater than the device holding current.

2. The circuit of claim 1, wherein said switching device is caused to turn off at a current magnitude at least an order of magnitude greater than said holding current.

3. The circuit of claim 1, wherein said cyclically pulsing means comprises: means for receiving an external signal for controlling the turning-on and turning-off of said switching device; and means for providing said control electrode signal with a magnitude sufficient to turn on said switching device responsive to either the presence of a turn-on signal at said external signal receiving means or the presence of both said first signal and that one of said second signal conditions responsive to said control electrode drive signal being at a turn-off condition.

4. The circuit of claim 3, wherein said pulsing means further includes means for controlling the time-rate-of-change of said control electrode signal.

5. The circuit of claim 3, wherein said providing means comprises: an AND gate having a first input receiving said first signal, a second input receiving said second signal, and an output; and an OR gate having a first input connected to the output of said AND gate and a second input corrected to said external signal receiving means, and an output adapted for providing said control electrode signal.

6. The circuit of claim 1, wherein said voltage monitoring means comprises: a comparator having an inverting input receiving said voltage across said device controlled-circuit, a non-inverting input, and an output at which said first signal appears; and means coupled to said comparator non-inverting input for providing a reference voltage thereto of a magnitude establishing the maximum voltage across the switching device controlled-circuit in both of the turned-on and latched conditions of said switching device.

7. The circuit of claim 6, further comprising a current-limiting resistance connected between said comparator inventing input and said device.

8. The circuit of claim 1, wherein said control-electrode-signal monitoring means comprises: a comparator having an inverting input, a non-inverting input and an output at which said second signal is provided; means for providing a reference potential to said non-inverting input to establish the magnitude of said control electrode signal at which said switching device should switch between the conductive and non-conductive conditions of said controlled-circuit; and time-delay means for delaying, by a predetermined time amount, any change in the magnitude of said control electrode signal prior to applying the delayed signal to said comparator inverting input.

9. The circuit of claim 1, wherein said power switching device is adapted for controlling the flow of current through a load from a unipolarity source.

10. A circuit for the self-commuted turning-off of each of a plurality of power switching devices, each of the type having a control electrode and a circuit in which the flow of current is controlled by the magnitude of a drive signal at the control electrode thereof, each controlled-circuit being characterized by latching in the conductive condition at a relatively high current level and remaining latched even in the presence of a turn-off magnitude of the control electrode signal, until the controlled-circuit current is reduced to a holding current substantially less than said latching current, said plurality of power switching devices being arranged in a circuit configuration adapted for controlling the flow of current through a load from a bipolarity source, said circuit comprising:

means associated with each of said plurality of switching devices for preventing the application of an improper polarity of voltage across the controlled-circuit of the associated device;

means for monitoring a load-current-related parameter of the controlled-circuit of each of the plurality of switching devices and responsive to a preselected proper polarity of the voltage across the controlled-circuit of each associated one of said plurality of switching devices to provide a first signal responsive to detection of at least a latched condition in any one of said plurality of switching devices;

means for monitoring the control electrode signal magnitude to provide respective first and second conditions of a second signal responsive to detection of respective first and second magnitudes of said control electrode signal sufficient to require a respective turning-off and turning-on of current flow through all of said plurality of switching devices; and means for pulsing the control electrode signal, responsive to the presence of both said first signal and a selected one of said second signal conditions, to cause all of the plurality of switching devices to turn off at a current magnitude greater than the holding current of each switching device.

11. The circuit of claim 10, wherein said first signal providing means comprises: a comparator having an inverting input, a non-inverting input, and an output at which said first signal appears; means for providing a signal to said comparator non-inverting output of magnitude defining the highest controlled-circuit voltage at which any one of said plurality of switching devices is in one of the turned-on and latched conditions; and means for connecting said comparator inverting input to the controlled-circuit of only those of said plurality of said switching devices having said proper voltage polarity thereacross.

12. The circuit of claim 11, wherein said connecting means comprises a resistance element connected between said inverting input and a circuit common potential; and a like plurality of unidirectionally-conducting elements, each connected between the non-common-potential terminal of an associated one of said plurality of switching devices and said comparator inverting input, and each poled so as to be capable of conduction only if said proper voltage polarity is applied to the controlled-circuit of the associated switching device.

13. The circuit of claim 10, wherein said first signal providing means comprises: a like plurality of comparators each having an inverting input receiving the voltage across the controlled circuit of an associated one of said plurality of switching devices, a non-inverting input connected to all other non-inverting inputs, and an output; means for providing a common reference signal to all of said comparator non-inverting inputs, of magnitude establishing the maximum magnitude of said controlled-circuit voltage for a switching device in one of the turned-on and latched conditions; and means for providing said first signal if the output of any of said plurality of comparators is at a predetermined condition.

14. The circuit of claim 13, wherein said providing means is an AND gate having a plurality of inputs equal to the number of said plurality of comparators, with each gate input being connected to an associated comparator output.

* * * * *